US005867411A

United States Patent [19]

Kumar

[11] Patent Number: 5,867,411
[45] Date of Patent: Feb. 2, 1999

[54] KALMAN FILTER IONOSPHERIC DELAY ESTIMATOR

[75] Inventor: Rajendra Kumar, Cerritos, Calif.

[73] Assignee: The Aerospace Corporation, El Segundo, Calif.

[21] Appl. No.: 770,079

[22] Filed: Dec. 19, 1996

[51] Int. Cl.[6] .............................. G06F 17/10; H03H 7/30; H03D 3/28
[52] U.S. Cl. .................... 364/724.011; 375/232; 375/346
[58] Field of Search ....................... 375/232, 346; 367/135; 342/63; 364/717.04, 724.01, 724.014, 724.02, 737, 724.19, 745.04, 449; 702/104, 196

[56] References Cited

U.S. PATENT DOCUMENTS

| | | | |
|---|---|---|---|
| 4,829,304 | 5/1989 | Baird | 342/63 |
| 5,144,595 | 9/1992 | Graham et al. | 367/135 |
| 5,323,322 | 6/1994 | Mueller et al. | 364/449 |
| 5,432,816 | 7/1995 | Gozzo | 375/232 |
| 5,563,917 | 10/1996 | Sheynblat | 375/346 |

OTHER PUBLICATIONS

"Optimal Filtering of Pseudoranges and Phases From Single–Frequency GPS Receivers", C.C. Goad, Navigation, vol. 37, No. 3, pp. 191–204, Fall 1990.

"A Gaussian Sum Approach to Phase and Frequency Estimation", K.S. Tam & J.B. Moore, IEEE Comm. vol. Com–25, No. 9, pp. 935–942, Sep. 1977.

"A Kalman Filter Approach to Precision GPS Geodesy", R. Grover Brown & P.Y.C. Hwang, Navigation, vol. 30, No. 6, pp. 338–369, 1983–1986.

"Detection Techniques in Least Squares Identification", R. Kumar & J.B. Moore, Automatica, vol. 17, pp. 805–819, Nov. 1981.

Rapid Static Positioning Based on the Fast Ambiguity Resolution Approach: The Alternative to Kinematic Positioning:, E. Frei & G. Beutler, Proceedings of 2nd Internat'l Symp. on Precise Positioning w/ GPS, Ottawa, Canada, pp. 1196–1216, Sep. 1990.

Primary Examiner—Ayaz R. Sheikh
Assistant Examiner—Rijue Mai
Attorney, Agent, or Firm—Derrick Michael Reid

[57] ABSTRACT

An estimator structure include a nonlinear modified Kalman filter for initial estimate and plurality of bias estimators and a parallel bank of Kalman filters for ambiguity resolution and providing final estimates. The estimator structure is useful for real-time computation of ionospheric propagation delay introduced in the navigation signals by dual frequency GPS receivers.

16 Claims, 1 Drawing Sheet

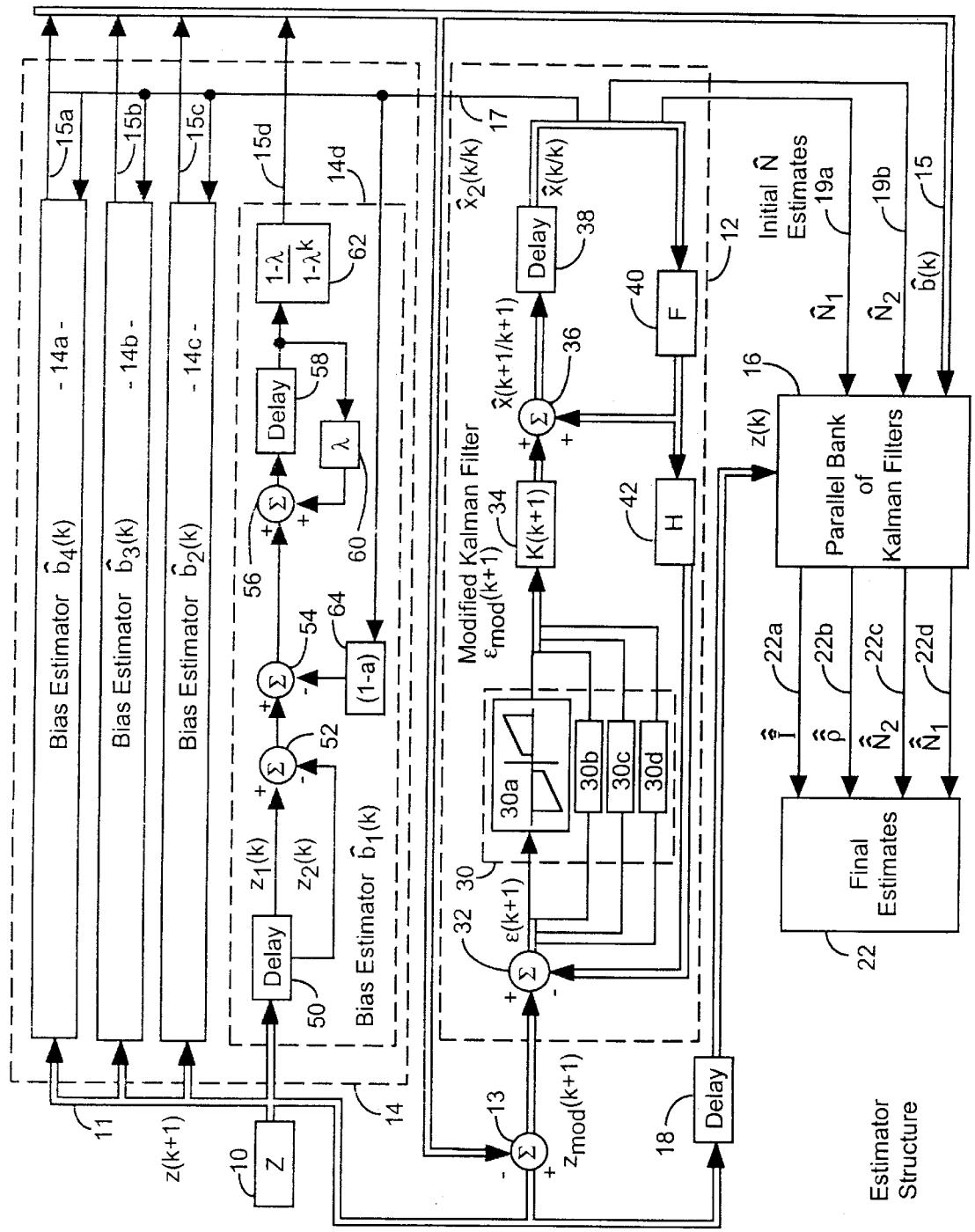

KALMAN FILTER IONOSPHERIC DELAY ESTIMATOR

STATEMENT OF GOVERNMENT INTEREST

The invention was made with Government support under Contract No. F04701-93-C-0094 by the Department of the Air Force. The Government has certain rights in the invention.

The invention described herein may be manufactured and used by and for the government of the United States for governmental purpose without payment of royalty therefor.

SPECIFICATION

Field of the Invention

The present invention relates to estimation methods and more particularly to ionospheric delay estimation using Kalman Filter, bias estimation and ambiguity resolution. Specifically, a parallel bank of Kalman filters is used for accurate and real-time compensation of ionospheric propagation delay down to centimeter level in dual frequency GPS receivers.

BACKGROUND OF THE INVENTION

Parameter estimators have been used to generate parameters estimates of parameters estimated from an input. Bias estimators have been used to generate bias esitmates of bias of an input. The parameter estimators and bias estimators are methods having many possible applications. One such application is range determination of the Gobal Positioning System (GPS) generating pseudoranges which are affected by potential bias, ionospheric propagation delays and phase ambiguities producing ranging errors. GPS receivers are used to acquire position on ground, in air or in space based upon the reception of satellite signals transmitted from the GPS satellite constellation. From the GPS satellite transmit antenna, the satellite signals propagate through free space, the ionosphere and the troposphere to the GPS receiver. The GPS constellation consists of 24 satellites operating in twelve-hour orbits at an altitude of 20,183 km and provides visibility of six to eleven satellites at elevations of five degrees or more above the horizon to users located anywhere in the world at any time. The navigation signals from the satellites consist of two rf frequencies, $L_1$ at 1575.42 MHz and $L_2$ at 1227.6 MHz. The $L_1$ and $L_2$ signals are modulated by pseudo-random noise (PN) or spread-spectrum (SS) codes and are also modulated with the navigation data-stream at 50 bps carrying various navigation messages. The signals transmitted from different satellites occupy the same rf bandwidth on a Code Division Multiple Accessing (CDMA) basis. In the CDMA techniques, different PN codes are assigned to different satellites and the receiver matches these codes with like reference codes generated in the receiver through cross-correlation technique implemented in Delay Lock Loops (DLLs). Individual DLLs are assigned to different satellites being tracked by the receiver in a parallel approach or a single loop is shared in a time division mode among many satellites in a single channel and less expansive receivers. In addition to making it possible to separate signals from different GPS satellites, the PN codes also make it possible to measure the range to the satellite by measuring the signal propagation delay from the satellite to the GPS receiver by measuring the relative phase of the received signal code phase with the local reference code phase. The accuracy with which such a propagation delay can be measured depends upon the PN code chip rate, the latter directly determining the rf bandwidth of the spread spectrum modulated signal. The measurement accuracy of the propagation delay is equal to a fraction of the PN code chip period, that is, the inverse of the code chip rate. The actual fraction depends upon the various details of receiver implementation and various sources of errors. Each GPS satellite has two codes assigned to it, a distinct C/A code with a chip rate of 1.023 MHz and a P-Code with different offsets and with a chip rate of 10.23 MHz. The $L_1$ signal is modulated with both the P and C/A codes in phase quadrature and the $L_2$ signal is modulated with the P-Code.

From the knowledge of signal propagation delay, the range to any satellite can be obtained by multiplying the delay by the velocity of light in free space if the signal is assumed to propagate in free space and all sources of measurement errors are ignored. However, as the GPS signal propagates through the ionosphere and troposphere of the earth, the delay and velocity of light product is termed pseudo-range and will be only approximately equal to the true geometric range. For the purpose of signal propagation delay measurement, the receiver clock must be in synchronization with the GPS satellite clocks controlling the timing of the transmitted GPS signals. The satellite clocks are highly stable atomic standards and any deviation of their timing from the GPS time is monitored and broadcast by the GPS Control Center to users through clock correction navigation messages. Any residual deviation will contribute to error in the pseudorange measurement. If the receiver had GPS time available to it, then by range measurement to at least three satellites, the receiver can determine its position relative to the GPS satellite by triangulation. Also, with the knowledge of GPS satellite positions in a common coordinate system such as the ECEF (Earth-Centered Earth-Fixed) system, the receiver can determine its position anywhere in the world. The positions of satellites are broadcast through ephemeris navigation messages. The absolute navigation accuracy provided by GPS is a function of the accuracy of the pseudorange measurements. The pseudorange measurements are affected by GPS system errors, such as ephemeris errors, clock errors, atmospheric effects of the ionosphere and troposphere and receiver noise.

Ionospheric and tropospheric effects may be significant. The troposphere is the lower part of the atmosphere extending up to an altitude of about 40 km. The propagation delay of the troposphere reaches about 1.9 to 2.5 meters in the zenith direction and increases approximately with the cosecant of the elevation angle. The tropospheric propagation delay is a function of barometric pressure, temperature, humidity, and other weather variables. However, it is rot a function of signal frequency. The tropospheric delay is modeled by mathematical models and can be computed from these models to high accuracy and the modeling error may be a few decimeters if the water vapor measurement is made with sufficient accuracy. The ionosphere ranges between apaproximately 100 km to 1000 km in altitude and behaves as a dispersive medium. The refractive index is a function of frequency, mainly due to the presence of free electrons. The ionospheric propagation delay is proportional to the total electron count which is equal to the integral of the electron density along the propagation path of the signal. Due to the dispersive nature of the medium, the ionosphere introduces a phase delay in the carrier phase and a group delay in the code phase which are equal and opposite in sign, i.e., the carrier phase is advanced while the code phase is delayed. The code delay is also inversely proportional to the square of the carrier frequency of the rf signal to a high approximation and is also a function of the elevation angle via the obliquity factor. In mid-latitude regions, the ionospheric delay can vary between 8 to 30 meters, depending upon the time of day, with possibly much higher values in the equatorial and polar regions. During the periods of high sunspot activity, the delays will be much higher and also exhibit faster variations with time. For single frequency GPS users, the ionospheric corrections are broadcast by GPS messages derived on the basis of mathematical models of the ionosphere. Such models compensate for about half of the delay. Thus, the ionospheric error after corrections is of the order of eight meters, one standard deviation, during a normal solar period. For many precision GPS applications, the ionospheric error is the dominant source of error. This error level is high and dual frequency measurements are used to more accurately estimate the ionospheric propagation delay.

The Standard Dual Frequency (SDF) method makes the ionospheric delay estimate on the basis of code phase measurements alone instead of both the code and carrier phase measurements which have relatively much higher noise variances compared to the carrier phase measurements. As such, the ionospheric delay estimation error using the standard dual frequency method is relatively high especially in the presence of moderate to high ionospheric activity.

Using a standard dual frequency estimation method, range is computed using the dual frequency code measurements providing two equations and two unknown so that an estimates for the ionosphere delays can be computed. Ionospheric delay estimation is conveniently described by a mathematical development. Estimating ionospheric propagation delay from noisy C/A and P/Y code signals, and the L1 and L2 carrier phase measurements may be formulated in terms of the following range equations.

RANGE EQUATIONS $$R_1 = \rho + \frac{I}{f_1^2} + v_{R_1}$$

$$R_2 = \rho + \frac{I}{f_2^2} + v_{R_2}$$

$$\lambda_1 \Phi_1 = \rho - \frac{I}{f_1^2} + N_1 \lambda_1 + v_{\phi_1}$$

$$\lambda_2 \Phi_2 = \rho - \frac{I}{f_2^2} + N_2 \lambda_2 + v_{\phi_2}$$

Range $\rho$ is the geometric distance between the GPS satellite transmitter and the GPS receiver, plus non-dispersive contributions such as tropospheric refraction and clock drift. The $I/f^2$ terms represent ionospheric propagation delays where I is proportional to the total electron count of the ionosphere and where $f_1$ and $f_2$ are the frequencies having respective wavelengths of $\lambda_1$ and $\lambda_2$ for the $L_1$ and $L_2$ signals. The range $\rho$ comprises the delay of free space and the delay of troposphere. From the $R_1$ and $R_2$ range equations, range $\rho$ can be determined. However, such determination does not include the reduction of bias nor the resolution of ambiguities. The terms $v_{R_i}$ and $v_{\phi_i}$ for i=1,2 represent receiver noise as manifested in code and cumulative carrier phase measurements respectively, and $N_1$ and $N_2$ are the integer ambiguities in the carrier phase measurements.

The range equations may be rewritten as observation equations using an ionospheric delay equation and a coefficient equation.

Ionospheric Delay Equation $$\bar{I} = I/F_1^2$$

Coefficient Equation $$a = f_1^2/f_2^2$$

Observation Equations $$R_1 = \rho + \bar{I} + v_{R_1}$$

$$R_2 = \rho + a\bar{I} + v_{R_2}$$

$$\lambda_1 \Phi_1 = \lambda - \bar{I} + N_1 \lambda_1 + v_{\phi_1}$$

$$\lambda_2 \Phi_2 = \lambda - a\bar{I} + N_2 \lambda_2 + V_{\phi_2}$$

In dual frequency ionospheric estimation methods, the ionospheric delay $\bar{I}$ is estimated as $\hat{\bar{I}}$ by an ionospheric delay estimation equation. An $\bar{I}$ estimation error e in the estimate of $\bar{I}$ and the variance var[e] are expressed and approximated in two error equations.

Ionospheric Delay Estimation Equation $$\hat{\bar{I}} = (R_1 - R_2)/(1-a)$$

Estimation Error Equation $$e = (v_{R_1} - v_{R_2})/(1-a)$$

Estimation Error Variance Equation $$\text{var}[e] = (\sigma_{R_1}^2 + \sigma_{R_2}^2)/(1-a)^2 \approx \sigma_{R_1}^2/(1-a)^2$$

The variance of the estimation error e involved in the $\hat{\bar{I}}$ estimate is a function of the measurement error variances $\sigma_{R_1}^2$ and $\sigma_{R_2}^2$ and the error variance var[e] is accordingly approximated because the noise variance associated with C/A code phase measurements is much higher compared to the noise variance of the P/Y code measurements as in the case of P/Y and C/A code receivers. By averaging $\hat{\bar{I}}$ over an appropriate interval, the error variance var[e] may be reduced. However, the averaging interval is limited due to ionospheric variations especially during periods of high solar activity. Moreover, if there is a relative bias affecting range measurements $R_1$ and $R_2$, due, for example, to multipath effects, averaging of $\hat{\bar{I}}$ will not reduce the estimation error e below some irreducible value even with very large integration times. A bias will give rise to a systematic error in addition to a random error component. In contrast, noise variances associated with carrier phase measurements are four to five orders of magnitude smaller. Similarly, any biases in the $\lambda_1 \Phi_1$ and $\lambda_2 \Phi_2$ measurements may also be one to three orders of magnitude smaller at the centimeter level as compared to the meter level in C/A code measurements. However, the presence of ambiguities $N_1$ and $N_2$ in $\lambda_1 \Phi_1$ and $\lambda_2 \Phi_2$ observation equations preclude the possibility of using these two equations alone for the ionospheric delay estimation. In a simpler version, the estimates of $\rho$ and $\bar{I}$ are obtained by differencing and averaging of the code and carrier phase measurements. In this approach, while the component of error due to random noise can be reduced, the error due to bias remains unchanged.

Several possible sources of deterministic bias exist in GPS receivers, including GPS satellite transponder differential group delay and/or the residual and slowly varying component of error due to multipath propagation. If such bias is significant and on the order of one meter, then ionospheric estimation error in the standard dual frequency method will be more than two meters. Bias delays can also vary slowly with time, for example, due to satellite transponder differential group delays variation with temperature and residual or slowing varying error due to multipaths. Bias determination and then bias elimination involves a constant plus a superimposed random error component.

Carrier phase measurements have lower noise but increased ambiguities. Ambiguity resolution follows from position determination using differential GPS. Integer ambiguity results from uncertainty of signal phase relationships at the time of reception of the received signals. The inherent periodic nature of the transmitted carrier frequency creates an integer cycle ambiguity, where each cycle of a signal represents distance of one signal wavelength traveled. Ambiguity resolution has not been applied specifically to ionospheric delay estimation in relative and differential GPS, but rather knowledge of ionospheric propagation delay is assumed or the differential ionospheric delay is simply neglected. Integer ambiguities resolution in relative and differential GPS disadvantageously assume ionospheric delay, rather than resolving ambiguity for ionospheric delay estimation.

The standard dual frequency ionospheric estimation method does not provide optimum solutions. The standard dual frequency ionospheric estimation method does not include bias estimation or ambiguity resolution and may not be adequate for GPS precision approach and landing of aircraft. Ionospheric estimation error due to significant: bias must be minimized. The ionospheric delay estimation error is one of the most significant sources of system position error in GPS applications. There exists a need to reduce biases, resolve ambiguities and significantly increase estimation accuracy.

Ionospheric delay methods are important to Wide Area Augmentation System (WAAS) reference stations, Geostationary Earth Orbiting (GEO) uplink station (GUS), and codeless receivers. Proper operation of GPS-WAAS for precision approach and landing of aircraft requires that divergence between code and carrier phase in the signal broadcast from GEO satellites be strictly controlled so that the signal closely mimics GPS signals wherein code and carrier are coherently generated onboard the GPS satellite. In the WAAS network, signals are generated at the GEO Earth station and code-carrier divergence can arise on the GEO uplink or in the GEO bent pipe transponder. By making very accurate estimates of uplink and downlink ionospheric delay the required coherence between the code and carrier phase of the signal transponder from GEO can be maintained. Moreover, accurate ionospheric delay estimates at the WAAS reference stations will result in reduced vertical navigation error in GPS WAAS-based precision approach of aircraft and thereby increase flight safety margins. Existing ionospheric delay estimates disadvantageously have errors as large as two meters or higher and are therefore unsuitable for accurate real time estimation of the ionospheric delays. These and other disadvantages are eliminated or mitigated using the present invention.

SUMMARY OF THE INVENTION

An object of the invention is provide parameter estimations free of bias and ambiguities.

Another object of the present invention is to provide a method of generating initial parameter estimates of paramters estimated from an input having a bias and being a series of signals at a respective plurality of discrete times.

Another object of the present invention is provide a method for generating bias estimates and the initial parameter estimates from an input having a bias introducting an estimation error which is reduced by recursive estimations at a plurality of discrete times to suppress the bias from the input to reduce the estimation error using a Kalman filter modified by nonlinear bias rejection.

Another object of the present invention is to resolve ambiguity parameters of an input to provide final parameter estimates from bias estimates and initial parameter estimates using a parallel bank of Kalman filters providing final parameter estimates free of bias and ambiguities.

Yet another object of the present invention is to estimate range and ionospheric propagation delay parameters from GPS pseudorange inputs having bias and ambiguities.

Still another object of the invention is to provide ionospheric delay estimations free of integer cycle phase ambiguities and transponder delay bias of dual frequency signals used in the global positioning system.

The present invention, in its broad aspect, is a method of generating initial parameter estimates of parameters estimated from an input having a bias and being a series of signals at a respective plurality of discrete times. The initial parameter estimates are generated using recursive bias estimations and initial parameter estimations to reduce estimation error by suspressing bias. The initial parameter estimates are generated using a modified Kalman filter having nonlinear bias rejection. In another broad aspect of the present invention, ambiguity parameters are resolved using a parallel bank of Kalman filters in cascade with the modified Kalman filter. Bias free and unambiguous parameter estimation can be applied to various discrete time input signals having bias and ambiguities.

The broad aspects of the invention are preferably applied to range and ionospeheric delay parameters estimated from four GPS pseudorange inputs having bias and integer cycle phase ambiguities. Four respective bias estimators are preferably connected to a modified Kalman filter providing initial parameter estimates and connected to a parallel bank of Kalman filters providing final estimates free of ambiguities and bias. In the broadest aspect of the invention, an estimator structure includes a modified Kalman filter for initial estimate and a plurality of bias estimators for bias estimation and a parallel bank of Kalman filters for ambiguity resolution and final estimates production.

The estimator structure is preferably used for accurate real-time computation of ionospheric propagation delays experienced by $L_1$ and $L_2$ navigation signals from GPS satellites. Increased accuracies in estimating ionospheric delay can result in more than an order of magnitude improvement in dual frequency receivers currently in use in various military applications where ionospheric delays are estimated with accuracies of between one-half and two meters. For civilian applications, the technique is applicable to WAAS reference stations, WAAS GUS code-carrier coherence control and codeless receivers. It can also be applied to future Block IIF receivers in the event that the dual frequency option for civilian use is exercised. The high precision obtained by the proposed algorithm in ionospheric delay estimation can satisfy margin requirements for vertical navigation error limits in the precision approach and landing phase of aircraft navigation. Such margin will increase safety and availability of WARS precision approach and landing services to a larger coverage area.

The preferred estimation method uses carrier phase measurements with small noise variance with a modified Kalman filter and a bank of parallel Kalman filters for solving the problem of deterministic bias and integer ambiguities. The number of filters in the Kalman filter bank is determined by the level of uncertainty provided by the modified Kalman filter and can be dynamically adjusted with the length of duration over which the range measurements are made. Range, delay, and integer estimations are provided by the modified Kalman Filter.

Initial integer estimates are associated with a level of uncertainty used to provide a range of possible integer values in the parallel bank of Kalman filters. Integer ambiguities are resolved individually for pseudorange measurements to individual satellites thereby considerably simplifying the procedure. Deterministic bias is estimated using a bias estimation algorithm combined with the nonlinearly modified Kalman filter that provides the desired initial estimates of integer ambiguities and the level of uncertainty. The bank of parallel Kalman filters provides more refined estimates of integer ambiguities and ionospheric propagation delay. The method is applicable to any dual frequency GPS signal transmission including dual Y code, or Y and C/A code, in precision position service in certain military applications, $L_1$ and C-band C/A codes transmitted over GEO satellite in WAAS for the code and carrier coherence control by the GEO uplink, and future Block IIF GPS satellites transmitting C/A codes over L1 and L2 frequencies for civilian applications. The technique is also applicable to codeless receivers as well. These and other advantages will become more apparent from the following detailed description of preferred embodiment.

BRIEF DESCRIPTION OF THE DRAWINGS

The drawing is block diagram of an estimator structure.

DETAILED DESCRIPTION OF THE PREFERRED EMBODIMENT

Referring to the drawing of an estimator structure, an input 10 comprising a set Z of range measurements which are preferably outputs from a GPS receiver, not shown. The input set Z comprises $L_1$ and $L_2$ code-phase range measurements and $L_1$ and $L_2$ carrier-phase range measurements, which are $L_1$ and $L_2$ pseudoranges, $PR_1$, $PR_2$, and accumulated delta pseudoranges, ADR1 and ADR2. Z is sampled at sequential times as z (k+1) sequential inputs ranges 11. Sequential z(k+1) inputs 11 are communicated to a modified Kalman filter 12 through a summer 13. The four sequential z(k+1) inputs 11 are also respectively communicated to four bias estimators 14a, 14b, 14c and 14d providing respective $\hat{b}_1$ (k), $\hat{b}_2$ (k), $\hat{b}_3$ (k) and $\hat{b}_4$ (k) bias estimates 15a, 15b, 15c and 15d, respectively. The $\hat{b}$ (k) bias estimates 15 are communicated to the parallel bank of Kalman filters 16 and communicated to the modified Kalman filter 12 through the summer 13. The modified Kalman filter 12 provides an estimate $\hat{x}_2$ (k/k) to the bias estimators 14. The sequential z (k+1) inputs 11 are also delayed by a delay 18 providing a delayed input z(k) to the parallel bank of Kalman filters 16. The delay 18 delays the z(k+1) inputs for one sampling instance time for proper sequencing of computations. The modified Kalman filter 12 also provides initial integer $\hat{N}_1$ and $\hat{N}_2$ ambiguity parameter estimates 19a and 19b to the bank of filters 16. The bank of filters 16 provides final estimates 22 of an ionospheric delay $\hat{I}$ 22a, range $\hat{\rho}$ 22b, integer $\hat{N}_2$ 22c and integer $\hat{N}_1$ 22d. The final parameter estimates 22 may be used for improved navigation. The preferred estimator structure comprises a modified Kalman filter 12 connected to bias estimators 14 and a bank of parallel Kalman filters 16.

The modified Kalman filter 12 includes a non-linear bias rejection function 30 operating on a prediction error $\epsilon$ (k+1) from the summer 32 for suppressing bias effect upon the Kalman filter state estimate $\hat{x}$ (k/k). The non-linear function 30 provides a modified prediction error $\epsilon_{mod}(k+1)$ which is multiplied by a K(k+1) Kalman gain 34 providing an updated estimate vector $\hat{x}(k+1/k+1)$ which is summed with feedback by summer 36 and then delayed by delay 38 providing an updated delayed state estimate vector $\hat{x}(k/k)$ which is modified by an F matrix 40 and fed back directly to the summer 36 and also to the summer 32 through an H matrix 42. The $\hat{x}_2(k/k)$ output 17 is the second component of the filtered estimate of the state vector $\hat{x}(k/k)$ from the Kalman filter 12.

Each of the bias estimator 14a, 14b and 14c function the same as exemplar bias estimator 14d. Each bias estimator 14 operates on a different components of the inputs pseudorange measurement vector z(k+1) 11. A delay 50 delays the input z(k+1) to provide $z_1(k)$ and $z_2(k)$ which are subtracted from each other by summer 52 and modified by summers 54. The Kalman filter $\hat{x}_2(k/k)$ output 17 is multiplied by a (1−a) multiplier 64 providing a product subtracted by summer 54 from the summer 52 difference of $z_1(k)$ and $z_2(k)$. The modified output of the summer 54 is filtered by a loop comprising a summer 56, a delay 58 and a multiplier 60 and is then multiplied by the multiplier 62 to provide one of the respective bias estimates 15.

The bank of Kalman filters 16 is used to resolve ambiguities. In the state space formulation, x (k) represents the state vector at the kth update discrete time interval. The range equations may be rewritten in compact form by an x (k) vector definition state equation, a z(k) vector measurement state equation, a z(k) vector measurement definition state equation and a vector observation noise definition state equation all four of which are collectively referred to as state equations which use an H matrix defined by an H Matrix equation.

STATE EQUATIONS $x(k) = [\rho(k) I(k) N_1 N_2]^T$ $z(k) = Hx(k) + v(k)$ $z(k) = [R_1(k) R_2(k) \lambda_1 \Phi_1(k) \lambda_2 \Phi_2(k)]^T$ $v(k) = [v_{R_1}(k) v_{R_2}(k) v_{\phi_1}(k) v_{\phi_2}(k)]^T$

H MATRIX EQUATION $$H = \begin{bmatrix} 1 & 1 & 0 & 0 \\ 1 & a & 0 & 0 \\ 1 & -1 & \lambda_1 & 0 \\ 1 & -a & 0 & \lambda_2 \end{bmatrix}$$

The H matrix is non-singular and thus the observability condition is satisfied in a trivial manner. The co-variance of the measurement noise is R. The state dynamics is expressed in a state dynamics equation form using an F matrix defined by an F matrix equation.

STATE DYNAMICS EQUATION $$x(k+1) = Fx(k) + w(k)$$

F MATRIX EQUATION $$F = \begin{bmatrix} F_1 & 0 \\ 0 & I \end{bmatrix}$$

In the F matrix equation, $F_1$ is a 2×2 diagonal matrix modeling the dynamics of $\bar{I}$ and $\rho(k)$, and I is a 2×2 identity matrix which assumes no cycle slips. Cycle slips can easily be modeled by replacing I by an appropriate matrix. Similarly higher dimensional dynamical models for the pseudo-range can be incorporated easily by increasing the dimension of the state vector. The term $w(k)$ is the dynamic noise vector with co-variance matrix Q including any unmodeled error sources. The changes in the ionosphere assume an exponential decay model, i.e., the (2,2) coefficient of the matrix F is equal to $e^{-T/\tau_I}$. T and $\tau_I$ represent respectively the update interval and correlation time of the ionosphere. In implementation $\tau_I$ may be replaced by some bound or in more sophisticated implementation one may adaptively estimate $\tau_I$ to take into account the non-stationary behavior of the ionosphere. The variance of the second element of $w(k)$ is equal $(\beta T)^2$ where $\beta$ may range between one quarter meter per minute during quiet solar periods to one meter per minute during periods of moderate to high solar activity. The Kalman filter equations provide the estimate of the state vector.

Kalman Filter Equations $$\hat{x}(k+1/k+1) = F\hat{x}(k/k) + K(k+1)\epsilon(k+1)$$

$$\epsilon(k+1) = z(k+1) - HF\cdot\hat{x}(k/k)$$

$$P(k+1/k+1) = FP(k/k)F^T + Q$$

$$K(k+1) = P(k+1/k)H^T S^{-1}$$

$$S = HP(k+1/k)H^T + R$$

$$P(k+1/k+1) = P(k+1/k) - P(k+1/k)H^T S^{-1} HP(k+1/k)$$

A $\hat{\bar{I}}(k)$ time varying estimate equation expresses the ionospheric delay estimate as a component of state vector estimate $\hat{x}$ from the state vector estimate Kalman filter equation.

Time Varying Estimate Equation $$\hat{\bar{I}}(k) = \hat{x}_2(k/k)$$

In the Kalman filter equations, K (k+1) is the Kalman filter gain and P (k+1/k+1) and P (k+1/k) are the filter and predictor error co-variance matrices, respectively, at update interval k+1. The Kalman filter not only provides an estimate of $N_1$ and $N_2$ but also estimation error variances in the form of diagonal elements of P(k/k). The Kalman filter formulation does not take into account the fact that $N_1$ and $N_2$ are integers, and therefore has limited performance. However, the performance of the estimator algorithm can be improved using a bank of parallel Kalman filters when resolving $N_1$ and $N_2$ integer ambiguities.

The Kalman filter equation algorithm is performed until error variances in the estimation of $N_1$ and $N_2$ are both smaller than some specified bound $\sigma_0 2$. For example, $\sigma_0 = 1$ may be selected. Then with $\hat{N}_1$ and $\hat{N}_2$ denoting Kalman filter initial estimates of $N_1$ and $N_2$, respectively, at a time instance denoted by $k_0$, true $N_1$ and $N_2$ lie with high probability, e.g., 0.997 in the following interval, as revealed in estimation interval inequalities. A larger interval may be considered for increased probability.

Estimation Interval Inequalities $$\hat{N}_1 - 3\sigma_0 \leq N_1 \leq \hat{N}_1 + 3\sigma_0$$

$$\hat{N}_2 - 3\sigma_0 \leq N_2 \leq \hat{N}_2 + 3\sigma_0$$

With $N_{1p}$ and $N_{2q}$ representing integers in the range specified by the estimation interval inequalities, let $z^{pq}(k)$ and $x_p(k)$ represent the carrier phase measurement vector and state vector defined by $z^{pq}$ and $x^p$ vector equations.

Vector Equations $$z^{pq}(k) \equiv [(\lambda_1 \Phi_1(k) - N_{1p}\lambda_1)\ (\lambda_2 \Phi_2)(k) - N_{2q}\lambda_2)]^T$$

$$x_p(k) \equiv [\rho(k)\bar{I}(k)]^T$$

The parallel bank of Kalman filters perform recursions which are used for $k > k_o$ and for $N_{1p}$ and $N_{2q}$ in the range defined in the estimation interval inequalities.

Recursive Equations $$\hat{x}^{pq}(k+1/k+1) = F_1 \hat{x}^{pq}(k/k) + K_p(k+1)\epsilon^{pq}(k+1)$$

$$\epsilon^{pq}(k+1) = z^{pq}(k+1) - H_p F_p \hat{x}^{pq}(k/k)$$

$$P_p(k+1/k) = F_p P_p(k/k) F_p^T + Q_p$$

$$K_p(k+1) = P(k+1) H_p^T S_p^{-1}$$

$$S_p = H_p P_p(k+1/k) H_p^T + R_p$$

$$P_p(K+1/k+1) = P_p(k+1/k) -$$

$$P_p(k+1/k) H_p^T S_p^{-1} H_p P_p(k+1/k)$$

In these recursive equations, suffix p signifies the parallel Kalman filter and $H_P$, $F_P$, $Q_P$ and $R_P$ denote appropriate (2×2) sub-matrices of H, F, Q and R respectively. Only the updates $\hat{x}^{pq}$ and $\epsilon^{pq}$ recursions depend upon the indices p, q while the Pp, Kp, Sp and Pp recursions are independent of p and q. Therefore only $\hat{x}^{pq}$ and $\epsilon_{pq}$ recursions need to be performed p multiplied by q (p×q) times. Modified residual squared sum is then computed using a residual equation.

RESIDUAL EQUATION $$J^{pq}(M) = \sum_{k=k_0+1}^{k_0+M} [\epsilon^{pq}(k)]^T S_p^{-1} \epsilon^{pq}(k) + w(k) \times [z_C(k) - H_C F_C \hat{x}^{pq}(k/k)]^T R_C^{-1} \times$$

$$[z_C(k) - H_C F_C \hat{x}^{pq}(k/k)]$$

In the residual equation, suffix C signifies code phase measurements and thus $z_C(k)$ is the first two-dimensional sub-vector of $z(k)$ while $H_C$, $F_C$, and $R_C$ denote the first (2×2) diagonal sub-matrices of H, F, and R respectively. Time-varying weight $w(k)$ may start at some value $w_{max}$ at $k=k_o$ and monotonically reduce to $w_{min}$ at $k=k_o+M$. The initial conditions for the recursive equations are given by initial condition equations for all p and q.

Initial Condition Equations $$\hat{x}^{pq}(k_0/k_0) = \hat{x}_C(k_0/k_0)$$

$$P_p(k_0/k_0) = P_C(k_0/k_0)$$

The $\hat{x}_C(k_o/k_o)$ term is the first two-dimensional component of $\hat{x}(k_o/k_o)$ and $P_C(k_o/k_o)$ is the first (2×2) diagonal block of $P(k_o/k_o)$. The weighting procedure described progressively reduces contribution of noisy code phase observations in determining ambiguities. The optimization index of the residual equation is then minimized with respect to indices p and q. If $p_0$ and $q_0$ are such minimizing indices, then $N_{1p0}$ and $N_{2p0}$ are estimates of the ambiguities $N_1$ and $N_2$ respectively, while $\hat{x}^{p_0 q_0}(k/k)$ is the estimate of the sub-state vector $[\rho(k)\ \bar{I}(k)]^T$.

In an alternative approach, the estimates of $N_1$ and $N_2$ are obtained for $M=M_0$, $M_0+1$, $M_0+2$, etc, and these terms are averaged to obtain the final estimates as $\hat{N}_1$ and $\hat{N}_2$ using an integer ambiguity estimation equation, and ionospheric propagation delay is estimated as a filtered average of an estimate D from a delay D estimation equation.

INTEGER AMBIGUITY ESTIMATION EQUATION $$\hat{N}_1(M) = \frac{1}{(M - M_0 + 1)} \sum_{k=M_0}^{M} N_{1p_0}(k)$$

$$\hat{N}_2(M) = \frac{1}{(M - M_0 + 1)} \sum_{k=M_0}^{M} N_{2q_0}(k)$$

DELAY D ESTIMATION EQUATION $$\hat{D} = [\lambda_1(\Phi_1(M) - \hat{N}_1(M)) - \lambda_2(\Phi_2(M) - \hat{N}_2(M))]/(a - 1)$$

The complete procedure is made recursive in that the test on the variances of $N_1$ and $N_2$ estimates provided by the Kalman filter update using the Kalman filter equation is made with time-varying bound $\sigma_o$ such as a $\sigma_s 2^{-(i_p/20)}$ where $\sigma_s$ is the initial value of $\sigma_0$ and $i_p$ is the number of times the parallel Kalman filter has been reset in the past. This ensures that true $N_1$ and $N_2$ do not remain outside the range given by estimation interval inequalities even with small probability and also to take into account possible cycle slips wherein the initial estimates $\hat{N}_1$ and $\hat{N}_2$ can vary significantly with time.

The above procedure can be summarized as using the range equations or equivalently the observation equations wherein there is no deterministic bias, that is, the noise vector v (k) is a zero mean and independent sequence, such that first obtain the estimate of N1 and N2 by either the Kalman filter as described by the Kalman filter equations or by combination of the Kalman filter equations and a bank of Kalman filters as described in the recursive equations and then use the $\lambda_1 \Phi_1$ and $\lambda_2 \Phi_2$ observation equations modified by $\hat{N}_1 \lambda_1$ and $\hat{N}_2 \lambda_2$ respectively to obtain the refined estimates of $\rho(k)$ and $\bar{I}(k)$. The complete procedure is a real-time recursive estimation procedure.

In the presence of deterministic bias, which may be either a constant or a slowly varying function of time, in the model of the observation equations, the Kalman filter algorithms described above can result in significant asymptotic error in estimating the ionospheric propagation delay and ambiguities N1 and N2. In contrast to the estimation error due to random noise v(k), such an error arising due to bias does not reduce with the length of the observation interval and may very significantly impact GPS receiver performance. In practice, several possible sources exist for such bias. One source is the GPS satellite transponder differential group delay. The second possible source is the residual multipath error. The GPS receiver is expected to eliminate most of the multipath error by applying one of several possible conventional algorithms for this purpose. However, any residual uncompensated multipath error component having very slow variation over the period of interest, can also be treated as an unknown bias term. The relatively rapidly-varying component will be averaged out with random noise v (k). The method presented for estimation and compensation is for such a slowly-varying or constant bias.

In the presence of bias, the z (k) vector measurement equation is replaced by a modified observation vector equation using a b matrix equation.

Observation Vector Equation $$z(k) = Hx(k) + v(k) + b$$

Matrix Equation $$b = [b_1 b_2 b_3 b_4]^T$$

The b matrix is the bias vector. The proposed method is general, and capable of estimating all components of vector b. It is described here to illustrate bias estimation when $b_1 \neq 0$ and the remaining components are zero. This is the situation one encounters, for example, when trying to estimate GPS transponder differential group delay wherein common mode transponder group delay is absorbed in the pseudorange $\rho$ and the differential component is represented by $b_1$.

In this method it is assumed that an upper-bound $B_j$ on the magnitude of bias $b_j$ is known and that such a bound is relatively small compared to the rms value $\sigma_{vj}$ of the corresponding noise term $v_j$. This can easily be satisfied by processing observations at the sufficiently small update interval T, since $\sigma_{vj}$ is proportional to $1/\sqrt{T}$ and the bias term is not influenced by T. To estimate the bias $b_1$, the state vector x is estimated from the Kalman filter equations after replacing $z_1(k)$, the first component of $z(k)$, by $z_{1mod}(k)$ as defined in zmod and k range equations.

Modified Measurement Equation $$z_{1mod}(k) = z_1(k) - \hat{b}_1(k)$$

$$k = k_{init}, k_{init}+1, \ldots$$

The first component of the prediction error $\epsilon(k)$ in the $\epsilon(k+1)$ Kalman filter equation is replaced by $\epsilon_{1mod}(k)$ as defined by the modified prediction error equation.

MODIFIED PREDICTION ERROR EQUATION $$\epsilon_{1mod}(k) = \begin{cases} \epsilon_1(k) & ; \ t_{1l} < |\epsilon_1(k)| < t_{1u} \\ 0 & ; \ \text{otherwise} \end{cases}$$

A co-variance matrix equation defines a modified dynamic noise covariance matrix $Q_m$.

Covariance Matrix Equation $$Q_m = Q + \Delta Q$$

In the modified prediction error equation $t_{1l}$ and $t_{1u}$ are selected according to the order of $b_1$. The rationale behind this inlier/outlier rejection is that observations most influenced by the bias are those wherein noise, or the prediction error, is on the order of $b_1$. If $b_1$ is relatively small in magnitude then the relatively small values of the prediction error will be most influenced in sign by the bias. On the other hand if the bias is relatively large then relatively large magnitude of the prediction error will result compared to the case of no bias. In either case, rejecting these extreme values of the prediction errors result in reduced influence of the bias on the estimation algorithm. Alternatively, the operation of the nonlinearity in the modified prediction error equation may be considered in terms of communication theory. It is well known that if signal plus white noise are input to a device with its transfer characteristics given by saturation type of nonlinearity, then the signal-to-noise ratio (SNR) at the output of the nonlinearity is small compared to the input SNR. Considering the unmodeled bias as the signal and the true prediction error, that is, the residual as the white noise when the residual sequence in the absence of unmodeled bias is known to be a white sequence, then the relative bias must be reduced due to the nonlinear operation. Moreover, the smaller the input SNR, the more the SNR degradation. Therefore, it is desired to start with noise rms value relatively higher compared to the unmodeled bias.

To illustrate the suppression of the bias through a nonlinearity of the type in the modified prediction error equation in a stationary environment, a Gaussian random variable with variance equal to 1 and some mean or normalized bias m is imputed to the equation with $t_{1l}$ equal to zero and varying upper threshold $t_{1u}$. With 40,000 input samples, and the threshold $t_{1u}$ over a range of values and for three distinct values of m equal to 0.5, 1, and 2 respectively, the output mean and variance are in general reduced as $t_{1u}$ is reduced. However, the quantity of interest is the output mean normalized by the square root of the output variance. The output normalized mean is smaller than the input mean for the complete range of $t_{1u}$ for the case of m equal to 0.5 and 1, while for the case of m equal to 2, the mean is suppressed only for $t_{1u}$ less than 2. In the case of m equal to 2 corresponding to the SNR of 4 does not represent a low SNR case. It is only necessary that the output normalized mean be significantly smaller than the input mean for the mean bias to asymptotically approach zero in the dynamic condition because the actual dynamic algorithm is recursive. A fraction of the input samples are non-zero at the output of the nonlinearity. A smaller value of the fraction indicates that the asymptotic estimation efficiency of the algorithm is reduced. When such an asymptotic efficiency is important, a dual algorithm can be used which will effectively improve the asymptotic efficiency once a good estimate of the bias is achieved. A corresponding result occurs when the threshold is held constant and the input mean is varied over a range of 0–2 for three distinct values of the threshold $t_{1u}$. The output normalized mean is smaller than the input mean for the complete range of mean and all three value of $t_{1u}$. The case of $t_{1u}=\infty$ corresponds to no nonlinear operation and then the output normalized mean is equal to the input mean for this case.

In the Kalman filter algorithm operating on the modified measurements and with the modified prediction error, the dynamic covariance matrix Q appearing in Kalman filter update is modified to $Q_m$ obtained from the covariance matrix equation. In the special cases of the modified prediction error equation, $t_{1l}$ equal to zero is appropriate for a relatively large bias or $t_{1u}$ may equal $\infty$ for a relatively small bias. The bias is now estimated by the modified Kalman filter equations coupled with the following recursive bias estimator equation.

In the estimator structure of the drawing, the preferred estimator may be illustrated for the case of $b_1 \neq 0$; $b_i = 0$, $i > 1$, using bias estimator equations for $k \geq k_{init}$ where $k_{init}$ is some initiating interval and may be equal to 1.

BIAS ESTIMATOR EQUATIONS $$s(k) = \lambda \cdot s(k-1) + (1-\lambda) \times [R_1(k) - R_2(k) - (1-a)\bar{I}(k)]$$

$$\hat{b}_1(k) = \left(\frac{1-\lambda}{1-\lambda^k}\right) \cdot s_k$$

In the bias estimator equations, the parameter $\lambda$ in the interval $0 < \lambda < 1$ is the exponential data weighting coefficient, $\hat{b}_1(k)$ represents the recursive estimate of the bias, and s (k) is an intermediate variable. The modified measurement equation $z_{1mod}(k)$ yields the modified measurements used in the Kalman filter equation. If asymptotic estimation efficiency is of interest during bias estimation, then threshold $t_1$ may also be made to depend on $\hat{b}_1(k)$, its averaged version. In most situations, such a refinement may not be necessary Convergence of the estimation algorithm occurs, when the prediction error variance, bias, and threshold have the desired relative magnitudes. If the magnitude of $\hat{b}_1(k)$ is smaller than $|b_1|$, the residual bias present in the modified observation $z_{1mod}(k)$ is smaller than that in measurement $z_1(k)$ and therefore results in a smaller estimation error in estimating $\bar{I}(k)$ by the Kalman filter equations. This results in a better estimate of $b_1$ via bias estimator equations and achieves further cancellation of bias in the bias suppressed measurements. Asymptotically, $\hat{b}_1(k)$ approaches $b_1$ as k approaches $\infty$.

An examplar situation is when no transponder group delay bias exists and $\rho$ and $\bar{I}$ are constants during the observation period, and the initial integer ambiguities may be randomly selected to be $N_1 = 35$ and $N_2 = 20$ with Q=0. The measurement noise covariance matrix R may be selected to be a diagonal matrix with its diagonal elements given by [10 1 0.0001 0.0001]. This corresponds to the C/A and P code phase measurement error variances of 10 $m^2$ and 1 $m^2$ respectively corresponding to an update interval of 0.1 seconds for a typical commercial receiver. For carrier phase measurements, the assumed phase error variance of $10^{-4}$ $m^2$ corresponds to one centimeter rms and represents a conservative estimate of actual error variance expected for 0.1 sec update interval, that is with a ten hertz loop bandwidth. The initial filter error covariance matrix P (0/0) was selected to be a diagonal matrix with diagonal elements given by [20 20 400 400]. The convergence of ionospheric delay estimation error in meters is a function of number of iterations times. The Kalman filter equations provide an estimation error of a few centimeters within about 400 iterations or about forty seconds. However, when integer ambiguities are resolved after about 700 iterations, the parallel Kalman filter defined by the estimation interval inequalities, recursive, residual, vector, and initial condition equations reduces the estimation error by another order of magnitude to only a few millimeters.

In the above example, when the bank of parallel Kalman filters was initialized according to the Kalman filter error covariance matrix criteria and with $\sigma_s = 2$, such initializations may be recorded at various iterations up to, for example, 1500 iterations. Estimate of $N_1$ by the bank of the parallel Kalman filter bank after the first initialization shows that except for a very brief period of transience following each reset, the estimation of $N_1$ is equal to its true value of 35. In estimating ionospheric delay, estimates for $N_{1p}$ and $N_{2q}$ are obtained as the majority voted integer value in the latter half of the immediately preceding reset interval. Thus $N_{1p}$ and $N_{2q}$ remains identical to $N_1$ and $N_2$ for all times after iteration 1192 in spite of reinitializations. Alternatively the final estimates of $N_1$ and $N_2$ may be obtained with essentially the same result using the integer ambiguity estimation equation.

A deterministic bias vector, such as $b=[0.1\ 0.6\ 0\ 0]^T$, was introduced as in the modified observation equation with no explicit estimation or compensation for bias, to determine the effect of bias on the estimation of the integer ambiguity $N_1$ after its estimates are averaged through integer ambiguity estimation equations. While the Kalman filter equations yield error in estimating $N_1$, the parallel Kalman filter bank converges to the true value in the case of small bias. Ionospheric estimation was obtained through averaging the delay D estimation equation by a first order recursive filter with exponential data weighting coefficient $\lambda N_f$ close to 1.

For exemplar comparison, the same first order recursive filter is also used to reduce fluctuations of standard dual frequency estimates of the estimation equation. The estimation error due to the parallel Kalman filter equation is approximately one centimeter after a few thousand iterations while the estimation error due to the standard dual frequency estimation is about 0.75 meters in the limit. The weighting coefficient w(k) in the residual equation is selected to be time-varying decreasing inversely with the number of iterations from a maximum value, for example, 0.1, to a minimum value, for example, 0.001, in any one reset interval.

When deterministic bias is present, it is no longer guaranteed that the parallel Kalman filter recursive equations without bias suppression will provide an estimation error that will asymptotically converge to zero. The asymptotic error may be significant. An exemplar bias vector of $b=[0.3, -0.1, 0, 0]^T$ produces an asymptotic error of twenty centimeters. However, the Kalman filter equations improve the estimation error by a factor of three to five compared to SDF algorithm with filtering, although the integer ambiguity is not exactly resolved.

A next example considers the randomly varying ionospheric delay with no deterministic bias. The ionosphere is modeled with an ionospheric delay rate coefficient $\beta$ equal to 2.5 meters per minute, and ionospheric time constant $\tau_I$ equal to twenty-four minutes representing high solar activity. Performance of the Parallel Kalman filter equation is minimally dependent on these ionospheric parameters. In this example, the parallel Kalman filter algorithm provides an order of magnitude improvement in ionospheric delay estimation with no deterministic bias. Convergence of the integer ambiguities to true values results. The convergence of $[\hat{N}_1-\hat{N}_2-(N_1-N_2)]$ to zero is very rapid implying rapid convergence of the ionospheric delay estimate.

In another example, some receiver dynamics are included but without any deterministic bias. The receiver dynamics are modeled as first-order model with F (1,1)=0.999 and Q (1,1)=0.1 corresponding to a random range derivative of approximately three meters/seconds. In this example, the ionospheric estimation error also converges to small value. Higher order dynamics can be included easily in the framework of the ionospheric estimation method by increasing the state vector dimension.

When significant deterministic bias is present with significant ionospheric activity, performance of the estimation algorithm can be significantly degraded if the bias is significant and not explicitly estimated and compensated. For this case, the parallel Kalman filter or only KF is coupled with the modified prediction error and bias estimation and $z_{mod}$ equations thereby simultaneously estimating the bias, compensating for it in the measurements, and estimating the ionospheric delay. In this case, the dynamic noise covariance matrix is modified to $Q_m$ by the covariance matrix equation where Q is the actual covariance matrix and $\Delta Q$ is selected to equal a diagonal matrix with its diagonal elements given by [2 0 2 2]. An unknown bias of 0.8 meters is introduced into the C/A code phase measurements. The ionospheric estimation error is rapidly reduced to small value of about 0.2 meters. Within about 1000 iterations or 100 seconds, the bias estimate is close to the true value. By comparison, the ionospheric estimation error obtained by SDF algorithm with filtering is about 2 meters, because the SDF algorithm ignores the bias. With the present estimation method, once bias estimates and ambiguities have converged to their true values, the ionospheric error will be of the order of centimeters or smaller as determined only by carrier phase measurement noise variance.

When the lower threshold $t_{1l}$ in the modified prediction error equation is set equal to zero and $t_{1l}$=2, the bias estimation of the parallel kalman filter has improved performance. The Kalman filter covariance matrix P (k/k) may be reset periodically at an interval of 200 iterations to an initial value equal to a diagonal matrix with its diagonal elements given by [20 20 400 400]. The bias estimation error in this case becomes asymptotically zero and the ionospheric estimation error is equal to only a few centimeters in the limit, demonstrating the improvement achieved due to filter reinitialization.

In another example, when a higher bias of 3 meters was introduced with all the remaining parameters, the same as in previous examples, the asymptotic bias estimation error of about 0.1 meters is obtained with a corresponding small ionospheric estimation error. The ionospheric estimation error is reduced to about 0.1 meters rms compared to the error consisting of a constant 4.63 meters, plus a random component of about 0.5 meters obtained by the SDF algorithm with filtering, providing between one to two order of magnitude improvement.

In another example, the dynamic noise covariance matrix element Q(1,1) is equal to 5 that is much higher compared to the previous value of 0.1 and F(1,1) is selected equal to 1, and threshold $t_{1u}$ is equal to 4 or 3. An asymptotic bias estimation error of less than 0.2 meters is achieved in both cases of $t_{1u}$ values whereas the original bias is three meters.

To include relatively higher receiver dynamics, higher-order models for the pseudorange can be included in the signal model dynamic equation. For example, a third-order model for the pseudorange with the dimension of the state vector in the model equations equal to 6 is considered. The first (3×3) diagonal blocks of the F and Q matrices denoted by $F_3$ and $Q_3$ respectively are given by $F_3$ and $Q_3$ matrix equations.

$$F_3 = \begin{bmatrix} 1 & T & \frac{T^2}{2} \\ 0 & 1 & T \\ 0 & 0 & 1 \end{bmatrix}$$

$$Q_3 = \begin{bmatrix} \frac{T^4}{20} & \frac{T^3}{8} & \frac{T^2}{6} \\ \frac{T^3}{8} & \frac{T^2}{3} & \frac{T}{2} \\ \frac{T^2}{6} & \frac{T}{2} & 1 \end{bmatrix} (\sigma_I T)^2$$

Appropriate modifications are made in the definition of H and other matrices in state vector, state dynamics, H matrix and F matrix equations. In $F_3$ and $Q_3$ matrix equations, $\sigma_j^2$ is the variance of the jerk which is equal to the derivative of acceleration, and may be, for example, equal to $10^4$ meters/second$^3$. A bias of 2 meters is introduced. Bias estimation error as a function of time shows essentially zero error in the limit with a the corresponding ionospheric estimation error which is less than 0.1 meters after about 400 iterations. The estimation error in the range is essentially due mainly to random noise and is asymptotically in the range of ±0.25 meters because the error due to ionosphere is very small.

The performance of the bank of the parallel Kalman filters depends upon the relative magnitude of prediction error variance, bias, and threshold. The prediction error variance is given by the diagonal element of the Kalman filter update matrix P (k+1/k) and may be adjusted, for example, by adding ΔQ to Q and reinitializing the modified Kalman filter. Moreover, the P matrix is varying with k and therefore it may be necessary to make the threshold a function of k to achieve the best results. Other sources of errors such as tropospheric propagation error or clock error may affect the estimates. These sources of error are either corrected for in the definition of ρ or form part of the dynamics of ρ.

The parallel Kalman filter method with bias elimination enables precision ionospheric estimation with an order of magnitude or higher improvement. This method is based on the application of carrier phase measurements versus code phase measurements to estimate ionospheric delay. This method involves estimating integer ambiguities present in carrier measurements. Integer ambiguities are resolved by simultaneous processing of both the carrier and code phase measurements using the modified Kalman filter providing real values. A combination of the modified Kalman filter and the bank of parallel Kalman filters provides integer values for ambiguities- The resolved ambiguities are sensitive to any biases present in measurements that may arise from several possible sources such as residual uncompensated and slow-varying multipath error and GPS satellite transponder biases. For estimation, all such biases can be grouped into a single deterministic bias term varying slowly as compared to other quantities to be estimated. In practice, only code phase measurement biases are significant while carrier phase measurement biases are relatively negligible. Once deterministic bias is compensated for, true integer ambiguity values are obtained which can then be removed from the carrier phase measurements. Because deterministic bias and integer ambiguities are either constant or relatively slowly varying, once carrier phase measurements are corrected for ambiguities and/or any biases, the ADR measurements can be processed for estimating both ionospheric propagation delay and receiver pseudorange estimates. Ionospheric estimation errors in the range of a few millimeters to a decimeter are achieved compared to several meter error from the SDF algorithm. Bias and integer ambiguities are resolved in time frames of a few seconds to a few minutes. During most of the period of resolution the algorithm provides relatively high accuracy in estimating ionospheric delay.

Bias estimates and ambiguities can be tracked for slow variations. Once the transient phase of estimating bias and ambiguities is over, estimation accuracy is determined only by carrier phase measurements. Thus, the parallel kalman filter method is insensitive to the type of receiver, which may be P/Y code, dual C/A code, or a combination of P/Y and C/A code. The parallel Kalman filter method can be extended to codeless dual frequency receivers as well. The parallel Kalman filter method has the benefits of increased accuracy and integrity of the GPS-based applications.

The parallel Kalman filter ionospheric delay estimation method can be applied to a GPS/WAAS network using codeless receivers at present or using L1 and L5 dual frequencies in future Block IIF satellites in the event that dual frequencies are available for civilian applications. The WAAS reference stations can measure the ionospheric propagation delay with high accuracy even in the presence of significant bias. Therefore, the ionospheric error of the single frequency WAAS user receiver is expected to be reduced in the same proportion. Such reduced error will result in further reduction in the probability of tunnel incident in the precision approach of aircraft, thereby further enhancing flight safety. Alternatively, synergistically combining the WAAS broadcast ionospheric measurements with ionospheric estimates obtained by the dual frequency user receiver, the number of reference stations required to cover the CONUS (or later worldwide) service volume while satisfying the navigation requirements for error limits can be reduced, thus potentially reducing end-state WAAS system implementation cost.

The estimation method can be generally applied to any discrete time input having deterministic bias with and without integer ambiguity. For example, the estimation method can be applied to continuous wave interference estimation and rejection when the interference is modeled as bias. Those skilled in the art of estimator structures may adapt and modify the estimator method. Those modifications may nonetheless fall within the spirit and scope of the following claims.

What is claimed is:

1. A method of generating initial parameter estimates of parameters estimated from an input having a bias and being a series of inputs at a respective plurality of discrete times, the method comprising the steps of, bias estimating bias estimates from the inputs and from the initial parameter estimates, and initial parameter estimating the initial parameter estimates from the input and the bias estimates, the initial parameter estimates have an estimation error dependent upon the amount of the bias, the bias estimating step and the initial parameter estimating step recursively estimate in synchronism at each of the plurality of discrete times to suppress the bias from the input to reduce the estimation error, the initial parameter estimating step comprising the steps of:

bias suppressing the input by removing the bias estimates from the inputs for providing a suppressed bias input;

providing a prediction error from the suppressed bias input and from an input prediction, the prediction error indicating suppressed bias;

providing a modified prediction error by modifying the prediction error with nonlinear bias rejection;

providing the initial parameter estimates from the modified prediction error; and providing the input prediction error from the modified prediction error and the initial parameter estimates.

2. The method of claim 1 wherein the parameters comprise ambiguity parameters and the initial parameter estimates comprise ambiguity parameter estimates, the method further comprising the steps of input delaying the inputs to provide delayed inputs delayed by one of the plurality of discrete times, and resolving in synchronism at the plurality of discrete times the ambiguity parameters to provide final parameter estimates from the delayed inputs, the bias estimates and the initial parameter estimates.

3. The method of claim 2 wherein the ambiguity resolving step is a filtering step using a parallel bank of Kalman filters.

4. The method of claim 1 wherein all of the providing steps is a filtering step using a modified Kalman filter modified with nonlinear bias rejection.

5. A method of generating final parameter estimates of parameters estimated from an input having a bias and being a series of signals at a respective plurality of discrete times, the parameters comprise integer ambiguity parameters and the final parameter estimates comprise final ambiguity parameter estimates, the method comprising the steps of, bias estimating bias estimates from the inputs and from initial parameter estimates, bias suppressing the input by removing the bias estimates from the inputs for providing a suppressed bias input, providing a prediction error from the suppressed bias input and from an input prediction, providing a modified prediction error by nonlinear bias rejection of the prediction error for suppressing the bias, providing the initial parameter estimates from the modified prediction error, providing the input prediction error from the modified prediction error, the initial parameter estimates have an estimation error dependant upon the amount of the bias, the bias estimating step and all of the providing steps function to recursively estimate in synchronism at each of the plurality of discrete times to suppress the bias from the input to reduce the estimation error, input delaying the inputs to provide delayed inputs delayed by one of the plurality of discrete times, and resolving in synchronism at the plurality of discrete times the integer ambiguity parameters to provide the final parameter estimates from the delayed inputs, the bias estimates and the initial parameter estimates.

6. The method of claim 5 wherein the resolving step is a filtering step using a parallel bank of Kalman filters, and all of the providing steps is a filtering step using a modified Kalman filter with nonlinear bias rejection.

7. The method of claim 5 wherein the input is a plurality of inputs each of which is a respective series of signals at the respective discrete times, the bias estimating step comprises a plurality of bias estimating steps respectively for said plurality of inputs.

8. The method of claim 5 wherein the series of inputs are computed from modulating signals having a carrier phase uncertainty creating an ambiguity parameter in the series of inputs.

9. A method of generating $\hat{I}$ $\hat{\rho}$ $\hat{N}_2$ $\hat{N}_1$ final parameter estimates of parameters estimated from an input comprising four $PR_1$ $PR_2$ $ADR_1$ and $ADR_2$ pseudorange z (k+1) inputs each having a bias and each being a series of signals at a respective plurality of discrete times (k), thee parameters comprise range $\rho$ and ionospheric delay I parameters and $N_1$ and $N_2$ ambiguity parameters and the final parameter estimates comprise final range and ionospheric delay parameters estimates and $N_1$ and $N_2$ ambiguity parameter estimates, the method comprising the steps of, bias estimating $\hat{b}_1$ (k) $\hat{b}_2$ (k) $\hat{b}_3$ (k) and $\hat{b}_4$ (k) bias estimates in parallel from the respective four inputs $PR_1$ $PR_2$ $ADR_1$ and $ADR_2$ and from initial parameter estimates, bias suppressing the inputs by respectively removing the bias estimates from the inputs for providing respectively suppressed bias inputs, $z_{mod}$ (k+1), providing respective prediction error $\epsilon$ (k+1) the from suppressed bias inputs and from an input prediction, providing a modified prediction error $\epsilon_{mod}$ (k+1) f0r suppressing the bias, providing the initial parameter estimates $\hat{z}$ (k/k) from the modified prediction error, providing the input prediction error from the modified prediction error, the initial parameter estimates have an estimation error dependant upon the amount of the bias, the bias estimating step and all of the generating and providing steps function to recursively estimate in synchronism at each of the plurality of discrete times to suppress the bias from the input to reduce the estimation error, input delaying the four $PR_1$, $PR_2$, $ADR_1$ and $ADR_2$ pseudorange inputs to provide delayed inputs z (k) delayed by one of the plurality of discrete times, and resolving in synchronism at the plurality of discrete times the $N_1$ and $N_2$ ambiguity parameters to provide the final parameter estimates from the delayed inputs, the bias estimates and the initial parameter estimates.

10. The method of claim 9 wherein the initial parameter estimates $\hat{x}$(k/k) comrpises $\hat{x}_2$ (k/k) initial ionospheric delay estimates for generating the bias estimates, and $\hat{N}_1$ and $\hat{N}_2$ initial ambiguity estimates for generating the final parameter estimates.

11. The method of claim 9 wherein all of the providing steps function as a modified Kalman filter modified by four inlier/outlier rejection nonlinearity functions providing the modified prediction error.

12. The method of claim 9 wherein the resolving step functions as a bank of parallel Kalman filters.

13. The method of claim 9 wherein the four inputs have respective biases b1, b2, b3 and b4, one of the b1, b2, b3 and b4 biases is not zero and one of b1, b2, b3 and b4 biases is zero.

14. The method of claim 9 wherein the bias estimating step functions as four parallel bias estimators, one of which provides a zero bias estimate.

15. The method of claim 14 wherein the bias estimators are each a first order exponential data weighted filter.

16. The method of claim 10 wherein the $N_1$ and $N_2$ ambiguity parameters are derived from carrier phase uncertainties of $L_1$ and $L_2$ band carrier signals modulated by modulating signals from which $PR_1$, $PR_2$, $ADR_1$, and $ADR_2$ pseudorange inputs are computed.

* * * * *